United States Patent [19]

Erlam

[11] Patent Number: 4,508,228
[45] Date of Patent: Apr. 2, 1985

[54] CARD FRAMES

[75] Inventor: David P. Erlam, Winchester, England

[73] Assignee: Rittal-CSM Limited, Hampshire, England

[21] Appl. No.: 392,165

[22] Filed: Jun. 25, 1982

[30] Foreign Application Priority Data

Jun. 29, 1981 [GB] United Kingdom ............... 8119939

[51] Int. Cl.³ .............................................. H02B 1/02
[52] U.S. Cl. ..................................... 211/41; 361/415
[58] Field of Search .................... 211/41, 189, 26, 162, 211/46; 361/415, 399; 312/350

[56] References Cited

U.S. PATENT DOCUMENTS

| 3,255,758 | 6/1966 | Gauche | 211/162 |
| 3,640,399 | 2/1972 | Hartman | 361/415 X |
| 3,868,158 | 2/1975 | Laboue | 211/175 X |
| 3,899,721 | 8/1975 | Borchard et al. | 211/41 X |
| 4,328,897 | 5/1982 | Weiss | 361/415 X |

FOREIGN PATENT DOCUMENTS 2416620 8/1979 France .
1053352 12/1966 United Kingdom .
1230138 4/1971 United Kingdom .
1395315 5/1975 United Kingdom .

Primary Examiner—Robert W. Gibson, Jr.
Attorney, Agent, or Firm—Maky, Renner, Otto & Boisselle

[57] ABSTRACT

A card frame for housing electrical circuitry mounted on cards comprises end plates (10) separated by front and rear cross rails (12, 14) that mount card-guides (16) in which the cards can slide. Each card guide (16) comprises end elements (28a, 28b) engageable with the front and rear cross rails (12, 14) in first and second positions (FIG. 1 and FIG. 2) spaced in both the top-to-bottom and front-to-rear directions of the card frame. Each card guide (16) additionally comprises a shank (30) formed separately from the end members (28a, 28b) and assembled with them. If the shank (30) is of a first length the end elements (28a, 28b) will engage with the cross-rails (12, 14) in the first positions to accommodate a card of a first height, whereas if the shank (30) is of a second, smaller length the end elements will engage with the cross rails in the second positions to accommodate a card of a second, greater height.

9 Claims, 8 Drawing Figures

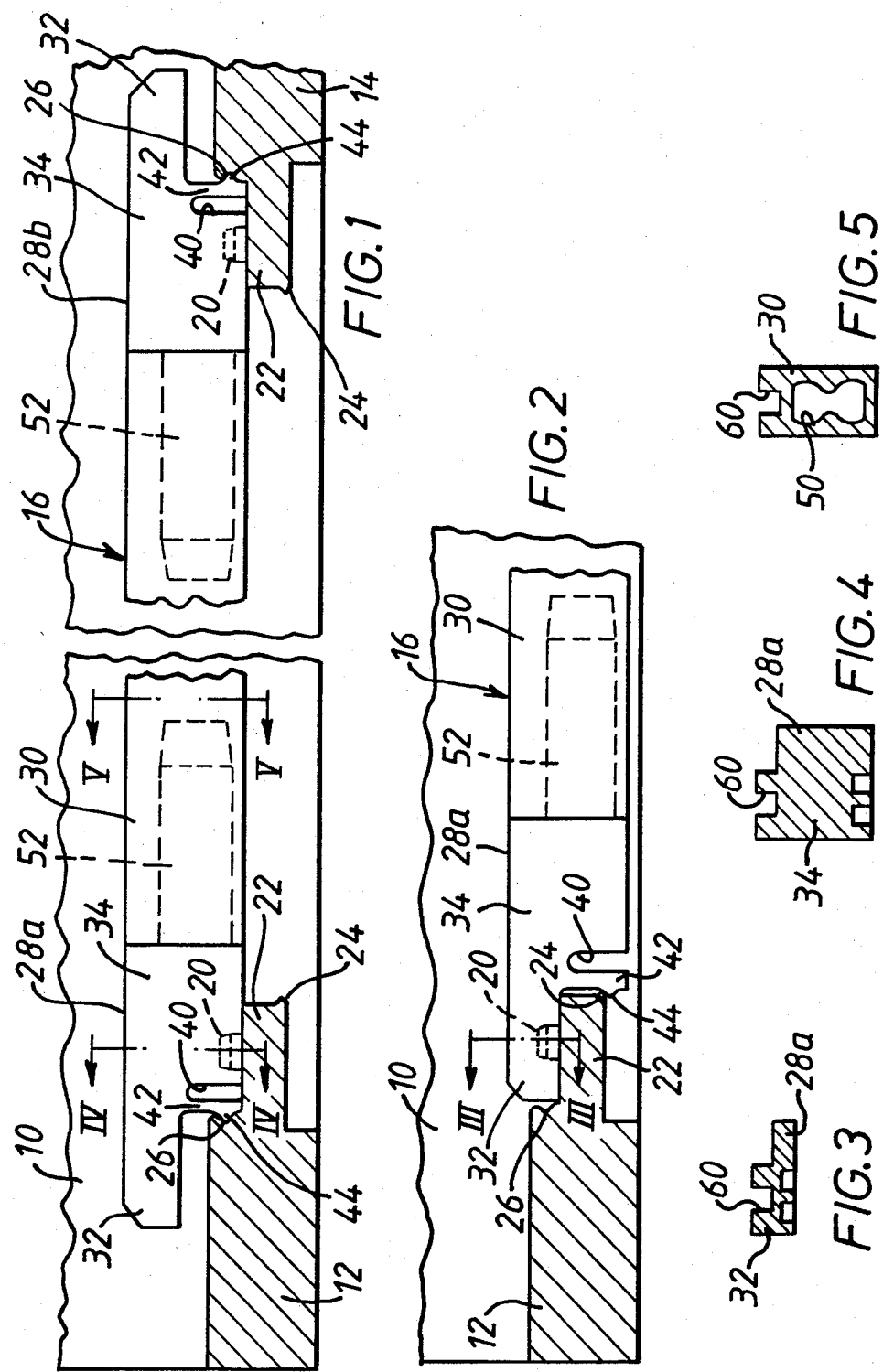

CARD FRAMES

BACKGROUND OF THE INVENTION

1. Field of the Invention

This invention relates to card frames, and is more particularly directed to card guides thereof.

2. Description of the prior art

A 'card frame' (also known as a 'sub-rack') is a kind of frame structure used to house electrical circuitry mounted on 'cards' which, for example, comprise circuit boards, for instance printed circuit boards, mounting circuit components. A typical card frame comprises a pair of side plates spaced apart by generally horizontally extending cross rails. Card guides are mounted on at least some of the cross rails to receive the cards, each card guide generally comprising an elongate member extending between a front and a rear cross-rail and having a channel to receive a portion of the card, e.g. an edge of a circuit board, as the card is slid into the card frame. Clearly, once mounted in place on upper and lower sets of front and rear cross-rails, an associated pair of upper and lower card guides can receive only a card of a predetermined height. Thus, only cards of that particular height can be received between the two sets of cross rails. This is acceptable if all of the cards to be fitted between those two sets of cross rails are of the same height; for instance if they are standard height 'Eurocards'. Sometimes, however, there may be a requirement to use cards of other heights instead of or even in conjunction with standard height cards such as Eurocards. This presents the manufacturers of card frames and the components thereof with something of a problem since they endeavour to provide a more or less standard range of products which can be supplied to electronics manufacturers for mounting their cards. Thus, if a particular card frame is designed to accept, say, Eurocards, if a particular user wishes to use cards of a different height instead of or even in conjunction with Eurocards, a technically unsatisfactory compromise often is required. For instance, if cards of a different height are to be used, this could be accommodated by moving the associated upper or lower cross rails. This would usually require an additional complication such as the provision of additional fixing apertures and location means on the side plates. If cards of different heights are to be used together between the same sets of cross rails, the cross rails must be positioned for the card of greater height and the card guides for the card of lesser height will have to be spaced from the cross rails by special spacer means.

SUMMARY OF THE INVENTION

The present invention provides a card frame comprising a front cross rail, a rear cross rail and a card guide engageable with the front and rear cross rails. The card guide comprises a pair of end elements each engageable with a respective one of said front or rear cross rail, each such element being engageable with its associated cross rail in a first position and in a second position, such positions being mutually spaced in both the top-to-bottom and front-to-rear directions of the card frame. The card guide further comprises a shank formed separately from the end members and assembled with the end members, whereby when the card guide is assembled the end elements will engage with the cross rails in their first positions or in their second positions, in accordance with whether the shank is of a first or a second length. Such a card frame enables cards of different heights readily to be accommodated between a common, fixed set of cross rails simply by equipping each card guide with a shank of one or the other of two predetermined lengths, the length of the shank being determined by the height of the particular card to be fitted at the position associated with each card guide. Thus, to accommodate cards of different heights, there is no need to provide means to enable the cross rails to be fitted at different positions. Further, there is no need to provide spacer means for spacing a card guide from the cross rail. All that is required is to have card guide end elements of a common type and to have available shanks of the two different lengths.

In a preferred embodiment of the invention disclosed hereinbelow, each end element has at least one engagement means at a first location and at least one further, like engagement means at a second location spaced from the first location in both the top-to-bottom and front-to-rear directions of the card frame. Each cross rail has engagement means complementary with the engagement means of the end elements and which can be engaged with the engagement means of an end element at either the first or second location. Preferably, the engagement means of the card guide comprises a hole (for example a blind hole or recess) and the complementary engagement means of the cross rail comprises a stud, e.g. formed as a half-shear, in the cross rail.

BRIEF DESCRIPTION OF THE DRAWINGS

The invention will now be further described, by way of illustrative and non-limiting example, with reference to the accompanying drawings, in which:

FIG. 1 is a partial sectional view through a card frame embodying the invention showing a card guide fitted to a pair of cross rails in a first position to receive a Eurocard;

FIG. 2 is a view corresponding to part of FIG. 1, and showing the card guide modified to be of shorter length by the substitution of a shorter shank and fitted to the cross rails in a second position to receive a card of greater height than a Eurocard;

FIG. 3 is a sectional view through a nose or end element of the card guide taken along the lines III—III in FIG. 2;

FIG. 4 is a sectional view of the nose or end element of the card guide taken along the line IV—IV in FIG. 1;

FIG. 5 is a sectional view of the shank of the card guide taken along the line V—V in FIG. 1;

DETAILED DESCRIPTION

Figure 6:
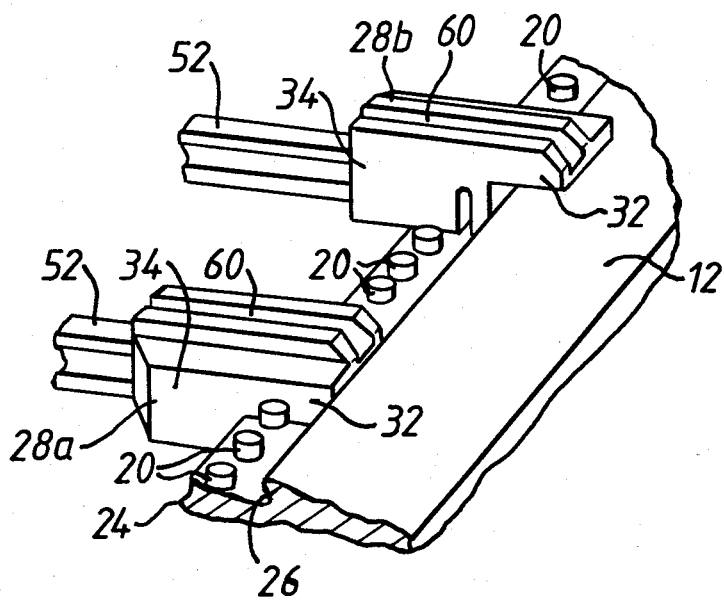
FIG. 6 is a partial perspective view of the card frame showing the noses only of two card guides fitted to a cross rail in the first and second positions, respectively.
Figure 7:
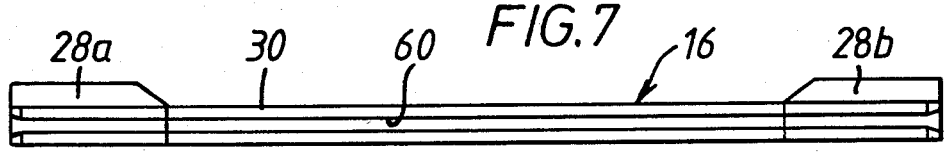
FIG. 7 is a top plan view of the card guide.
Figure 8:
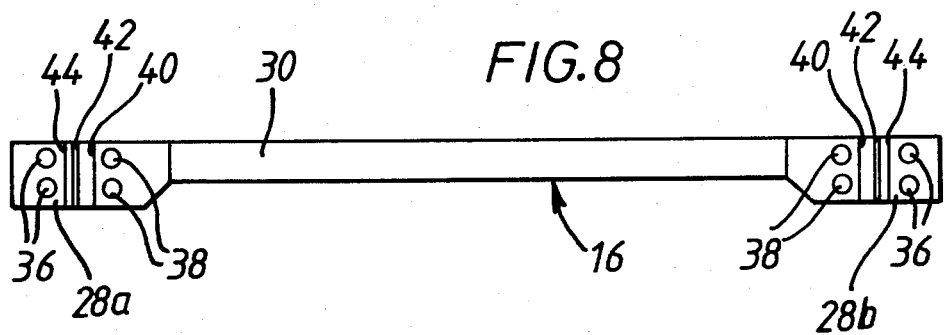
FIG. 8 is a bottom plan view of the card guide.

The illustrated card frame comprises a pair of side plates, one of which is shown at 10 in FIGS. 1 and 2. The side plates are in use disposed in respective vertical planes and are joined together and spaced apart by horizontally extending cross rails. A lower front cross rail 12 and a lower rear cross rail 14 are shown in the drawings. (The front rail 12 and rear rail 14 are not necessarily disposed precisely at the front and rear of the card frame; rather, it is sufficient for the rail 12 to be nearer the front of the card frame than the rail 14). Card guides 16 are mounted between the cross rails 12, 14 in a manner described in more detail below. Upper front and rear cross rails (not shown) are mounted between the side plates to receive further card guides, the card guides associated with the upper cross rails and the lower cross rails being associated in vertically spaced pairs to receive circuit cards in a manner generally well known in the art. The upper cross rails and card guides can be essentially the same as the lower ones, except of course for their orientation, whereby only the lower ones will be described. (The upper and lower cross rails are not necessarily disposed at the top and bottom of the card frame; rather, it is sufficient for the upper rails to be disposed nearer the top of the card frame than the lower rails.)

Each cross rail 12, 14 is in this embodiment an aluminium extrusion having a series of studs or projections 20 formed at equal pitch along a ledge 22 thereof. The studs 20 are formed as half-shears of the material of the ledge 22. The studs 20 are generally cylindrical, being slightly tapered at their free ends as can best be seen from FIGS. 1 and 2.

The lower edge of the free end of each of the ledges 22 is provided with a continuous lip 24. Above the ledge 22, a continuous recess or groove 26 is formed in each of the cross rails 12, 14.

Each of the card guides 16 comprises opposite noses or end elements 28a, 28b and a shank 30. The noses 28a and 28b and the shank 30 are preferably all of plastics material, the noses being mouldings and the shank being an extrusion.

The noses 28a and 28b are for convenience 'handed' whereby, as can be seen from the drawings, they are of slightly different appearance. However, they are in principle of the same construction. Consequently, only the nose 28a will be described in detail.

The nose 28a comprises an outer portion 32 of relatively low height and an inner portion 34 of relatively greater height. A pair of blind holes or recesses 36 are formed in the underneath surface of the outer portion 32, the spacing of the holes being equal to the spacing between the studs 20 of the cross rails and the size of the holes being substantially the same as that of the studs 20. A like pair of holes 38 is formed in the underneath surface of the inner portion 34. A slot 40 is formed in the inner portion 34 to define a flexible finger 42 having a ridge 44.

The shank 30 of each card guide 16 has an 'hourglass' shaped continuous aperture 50 (FIG. 5) formed within it along its length. Each nose 28a, 28b, has a correspondingly shaped tongue 52 protruding from its free end. Each card guide 16 is assembled by sliding the tongues 52 of the noses 28a, 28b into opposite ends of the aperture 50 in the shank 30 until the faces of the noses from which the tongues 52 extend abut the end faces of the shank 30.

As will be appreciated from the foregoing, each of the noses 28a, 28b can engage with its corresponding cross rail 12, 14 at a variety of positions along the cross rails by engagement of the holes 36 or 38 with any related adjacent pair of the studs 20. More importantly, for any position along the cross rail, each nose 28a, 28b can engage with the cross rail at one of two positions, such two positions being spaced from each other both vertically (i.e. in the top-to-bottom direction of the card frame) and transversely of the cross rails (i.e. in the front-to-rear direction of the card frame). A first such position is shown for both the noses 28a and 28b in FIG. 1. In this position, two of the studs 20 of the cross rail engage with the holes 38 of the nose. The nose is positively located in position by snap action resulting from deformation of the finger 42 and snapping of the ridge 44 into the groove 26. In the second position, shown in FIG. 2, two of the studs 20 engage with the holes 36 and positive location is provided by the ridge 44 on the finger 42 snapping under the lip 24 on the ledge 22 of the cross rail. In the first position, shown in FIG. 1, the card guides 16 will receive a Eurocard (or other card of standard height). That is to say, the card can be slid into the card guide 16 and guided therealong by means of a continuous channel 60 formed along the length of the noses 28a, 28b and the shank 30. In the second position, shown in FIG. 2, the card guide 16 will receive a card of a greater, predetermined height.

As will be evident, the spacing between the noses 28a, 28b is lesser in the case of FIG. 2 than in the case of FIG. 1, the difference in spacing being equal to twice the spacing between the holes 36, 38 in the two noses. Two alternative lengths of shank 30 are used in accordance with whether the card guide 16 is to be fitted in one or the other of the above positions. Thus, if a pair of standard noses 28a, 28b is fitted with a longer shank 30 having a length as shown in FIG. 1, the card guide 16 will readily snap into place between the cross rails 12, 14 as shown in FIG. 1 to receive a Eurocard. If the card guide 16 is fitted with an appropriately shorter shank 30, the noses 28a, 28b will readily engage with the cross rails 12, 14 in the lower position, as shown for the nose 28a, in FIG. 2, whereby the card guide will receive a card of greater height.

I claim:

1. A card frame having a front side, a rear side, a top side and a bottom side, and comprising a front cross rail, a rear cross rail and a card guide engageable with said front and rear cross rails, wherein:

said card guide comprises a pair of end elements each engageable with a respective one of said front or rear cross rails;

each said end element is engageable with its associated cross rail in a first position and in a second position, said first and second positions being mutually spaced in both the top to bottom and front to rear directions of the card frame; and said card guide further comprises a shank formed separately from said end elements and assembled with the end elements, whereby when the card guide is assembled the end elements will engage with the cross rails in their first positions or in their second positions, in accordance with whether the shank is of a first or second length, each said end element having at least one engagement means at a first location and at least one further, like engagement means at a second location spaced from said first location in both the top-to-bottom and front-to-rear directions of the card frame, and each said cross rail having engagement means complementary with said engagement means of said end elements and which can be engaged with the engagement means of an end element at either said first or second location.

2. A card frame according to claim 1, wherein said engagement means of said end elements and cross rails comprise interengageable holes and studs.

3. A card frame according to claim 2, wherein said engagement means of each said end element at each of said first and second locations comprises at least one hole and said complementary engagement means of said cross rails comprise studs formed on the cross rails.

4. A card frame according to claim 3, wherein said studs are formed as half-shears.

5. A card frame having a front side, a rear side, a top side and a bottom side, and comprising a front cross rail, a rear cross rail and a card guide engageable with said front and rear cross rails, wherein:

said card guide comprises a pair of end elements each engageable with a respective one of said front or rear cross rails;

each said end element is engageable with its associated cross rail in a first position and in a second position, said first and second positions being mutually spaced in both the top to bottom and front to rear directions of the card frame; and said card guide further comprises a shank formed separately from said end elements and assembled with the end elements, whereby when the card guide is assembled the end elements will engage with the cross rails in their first positions or in their second positions, in accordance with whether the shank is of a first or second length, each said end element including a resiliently deformable element that will deform and engage with respective configurations when the end element is engaged with the cross rail in said first and said second positions thereby to positively locate the end element in the respective first or second position.

6. A card frame having a front side, a rear side, a top side and a bottom side, and comprising a front cross rail, a rear cross rail and a card guide engageable with said front and rear cross rails, wherein:

said card guide comprises a pair of end elements each engageable with a respective one of said front or rear cross rails;

each cross rail having first and second means for engaging an end element and each end element having first and second means for engaging a respective one of the first and second engaging means on a cross rail, the first and second engaging means on each cross rail being spaced in both the top to bottom and front to rear directions of the card frame so that each said end element is engageable with its associated cross rail in a first position and in a second position, said first and second positions being mutually spaced in both the top to bottom and front to rear directions of the card frame; and said card guide further comprises a shank formed separately from said end elements and assembled with the end elements, whereby when the card guide is assembled the end elements will engage with the cross rails in their first positions or in their second positions, in accordance with whether the shank is of a first or second length.

7. A card frame according to claim 6 wherein said shank and said end elements have complementary engagement means associated therewith for assembling said shank with said end elements.

8. A card frame according to claim 7 wherein said complementary engagement means associated with said shank and said end elements comprises a mating tongue and groove connection between each end element and a respective end of the shank.

9. A card frame according to claim 8 wherein an aperture is formed in said shank and extends along the length of the shank, said aperture defining a groove at each end of the shank, each end element having a projecting tongue for engaging the groove defined at the respective end of the shank for engaging the end element with the shank.

* * * * *